United States Patent
Keel et al.

(10) Patent No.: US 8,446,181 B2
(45) Date of Patent: May 21, 2013

(54) SAMPLING CIRCUIT AND IMAGE SIGNAL AMPLIFYING CIRCUIT EACH INCLUDING FEEDBACK CLAMP BLOCK AND IMAGE SENSOR INCLUDING THE IMAGE SIGNAL AMPLIFYING CIRCUIT

(75) Inventors: Min-sun Keel, Seoul (KR); Young-kyun Jeong, Hwaseong-si (KR); Won-ho Choi, Suwon-si (KR); Ji-hun Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 32 days.

(21) Appl. No.: 13/086,752

(22) Filed: Apr. 14, 2011

(65) Prior Publication Data

US 2011/0254592 A1    Oct. 20, 2011

(30) Foreign Application Priority Data

Apr. 14, 2010   (KR) ..................... 10-2010-0034392

(51) Int. Cl.
  *H03K 5/00*    (2006.01)
(52) U.S. Cl.
  USPC ............................................................. 327/91

(58) Field of Classification Search
  None
  See application file for complete search history.

(56) References Cited

U.S. PATENT DOCUMENTS

| | | | | |
|---|---|---|---|---|
| 5,445,967 A | * | 8/1995 | Deuter | 436/164 |
| 6,812,790 B2 | * | 11/2004 | Ishihara et al. | 330/143 |
| 7,522,010 B2 | * | 4/2009 | Liang et al. | 331/185 |
| 7,746,096 B1 | * | 6/2010 | Yang | 326/30 |
| 7,843,712 B2 | * | 11/2010 | Lee | 363/60 |
| 2008/0205872 A1 | * | 8/2008 | Kinugasa | 396/127 |

FOREIGN PATENT DOCUMENTS

| | | |
|---|---|---|
| JP | 11-284912 | 10/1999 |
| JP | 2002-101264 | 4/2002 |
| JP | 2007-060350 | 3/2007 |
| KR | 1998-0012444 | 4/1998 |

* cited by examiner

*Primary Examiner* — Lincoln Donovan
*Assistant Examiner* — Sibin Chen
(74) *Attorney, Agent, or Firm* — Lee & Morse, P.C.

(57) ABSTRACT

A sampling circuit samples an input signal by using at least one switch, at least one capacitor, an amplifier, and a clamp block connected between an output terminal and a negative input terminal of the amplifier. The clamp block prevents a difference between a voltage level of the output terminal of the amplifier and a voltage level of the negative input terminal of the amplifier during sampling from exceeding a maximum voltage difference.

19 Claims, 7 Drawing Sheets

SAMPLING CIRCUIT AND IMAGE SIGNAL AMPLIFYING CIRCUIT EACH INCLUDING FEEDBACK CLAMP BLOCK AND IMAGE SENSOR INCLUDING THE IMAGE SIGNAL AMPLIFYING CIRCUIT

BACKGROUND

1. Field

Embodiments relate to a sampling circuit that samples and amplifies an image signal, and more particularly, to a sampling circuit including a feedback clamp block between an output terminal and a negative input terminal of an amplifier included in the sampling circuit, an image signal amplifying circuit that samples and amplifies an image signal and includes the feedback clamp block, and an image sensor including the image signal amplifying circuit.

2. Description of the Related Art

Image sensors include a plurality of unit image sensor circuits and an image signal amplifying circuit. The plurality of unit image sensor circuits detects an image signal. The image signal amplifying circuit samples the image signal output from the plurality of unit image sensor circuits and outputs the sampled image signal. The image signal amplifying circuit includes a plurality of switches, a plurality of capacitors, and an amplifier, and controls operation of the plurality of switches. The image signal amplifying circuit outputs an electric signal determined by an amount of electric charge accumulated in or discharged to a capacitor according to the intensity of an image signal via an output terminal of the amplifier.

SUMMARY

Embodiments are therefore directed to a sampling circuit that samples an input signal by using at least one switch, at least one capacitor, an amplifier, and a clamp block connected between an output terminal and a negative input terminal of the amplifier. The clamp block prevents a difference between a voltage level of the output terminal of the amplifier and a voltage level of the negative input terminal of the amplifier during sampling from exceeding a maximum voltage difference.

Embodiments are therefore directed to an image signal amplifying circuit that samples and amplifies an image signal, the image signal amplifying circuit including an amplifier, a first switch, a second switch, a first capacitor, a second capacitor, a third switch, a fourth switch, and a clamp block. In the amplifier, a positive input terminal is connected to a reference voltage. In the first switch, a first end thereof receives the image signal. In the second switch, a first end thereof is connected to a negative input terminal of the amplifier and a second end thereof is connected to an output terminal of the amplifier. In the first capacitor, a first end thereof is connected to the other end of the first switch and a second end thereof is connected to the negative input terminal of the amplifier. In the second capacitor, a first one end thereof is connected to the negative input terminal of the amplifier. In the third switch, a first end thereof is connected to the other end of the second capacitor and a second end thereof is connected to the output terminal of the amplifier. In the fourth switch, a first end thereof is connected to a common terminal of the second capacitor and the third switch, and a second end thereof is connected to the reference voltage. In the clamp block, a first end thereof is connected to the negative input terminal of the amplifier and a second end thereof is connected to the output terminal of the amplifier.

Embodiments are therefore directed to an image sensor including a vertical address decoder, an image sensor array, and a column amplifying array. The vertical address decoder generates a vertical address. In the image sensor array, a plurality of unit image sensor circuits that detect an image signal from outside are arranged in a two dimensional array and which outputs image data detected by a plurality of the unit image sensor circuits included in one horizontal line activated by the vertical address. The column amplifying array includes a plurality of image signal amplifying circuits that sample and amplify the detected image signal output from the plurality of unit image sensor circuits. The image signal amplifying circuit includes: an amplifier, a first switch, a second switch, a first capacitor, a second capacitor, a third switch, a fourth switch, and a clamp block. In the amplifier, a positive input terminal is connected to a reference voltage. In the first switch, one end thereof receives the image signal. In the second switch, one end thereof is connected to a negative input terminal of the amplifier and the other end thereof is connected to an output terminal of the amplifier. In the first capacitor, one end thereof is connected to the other end of the first switch and the other end thereof is connected to the negative input terminal of the amplifier. In the second capacitor, one end thereof is connected to the negative input terminal of the amplifier. In the third switch, one end thereof is connected to the other end of the second capacitor and the other end thereof is connected to the output terminal of the amplifier. In the fourth switch, one end thereof is connected to a common terminal of the second capacitor and the third switch and the other end thereof is connected to the reference voltage. In the clamp block, one end thereof is connected to the negative input terminal of the amplifier and the other end thereof is connected to the output terminal of the amplifier.

Embodiments are therefore directed to an image signal processing system including an image signal amplifying circuit. The image signal amplifying circuit includes: an amplifier, a first switch, a second switch, a first capacitor, a second capacitor, a third switch, a fourth switch, and a clamp block. In the amplifier, a positive input terminal is connected to a reference voltage. In the first switch, one end thereof receives the image signal. In the second switch, one end thereof is connected to a negative input terminal of the amplifier and the other end thereof is connected to an output terminal of the amplifier. In the first capacitor, one end thereof is connected to the other end of the first switch and the other end thereof is connected to the negative input terminal of the amplifier. In the second capacitor, one end thereof is connected to the negative input terminal of the amplifier. In the third switch, one end thereof is connected to the other end of the second capacitor and the other end thereof is connected to the output terminal of the amplifier. In the fourth switch, one end thereof is connected to a common terminal of the second capacitor and the third switch and the other end thereof is connected to the reference voltage. In the clamp block, one end thereof is connected to the negative input terminal of the amplifier and the other end thereof is connected to the output terminal of the amplifier.

Embodiments are therefore directed to an image signal amplifying circuit that samples and amplifies an image signal, the image signal amplifying circuit including an amplifier having a positive input terminal connected to a reference voltage, a first switch having a first end receiving the image signal, a second switch having a first end connected to a negative input terminal of the amplifier and a second end connected to an output terminal of the amplifier, a first capacitor having a first end connected to a second end of the first switch, the first capacitor having a second end connected to the negative input terminal of the amplifier, a second capacitor having a first end connected to the negative input terminal of the amplifier, and a clamp block having a first end connected to the negative input terminal of the amplifier and a second end connected to the output terminal of the amplifier, the clamp block being connected in parallel with the second switch.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
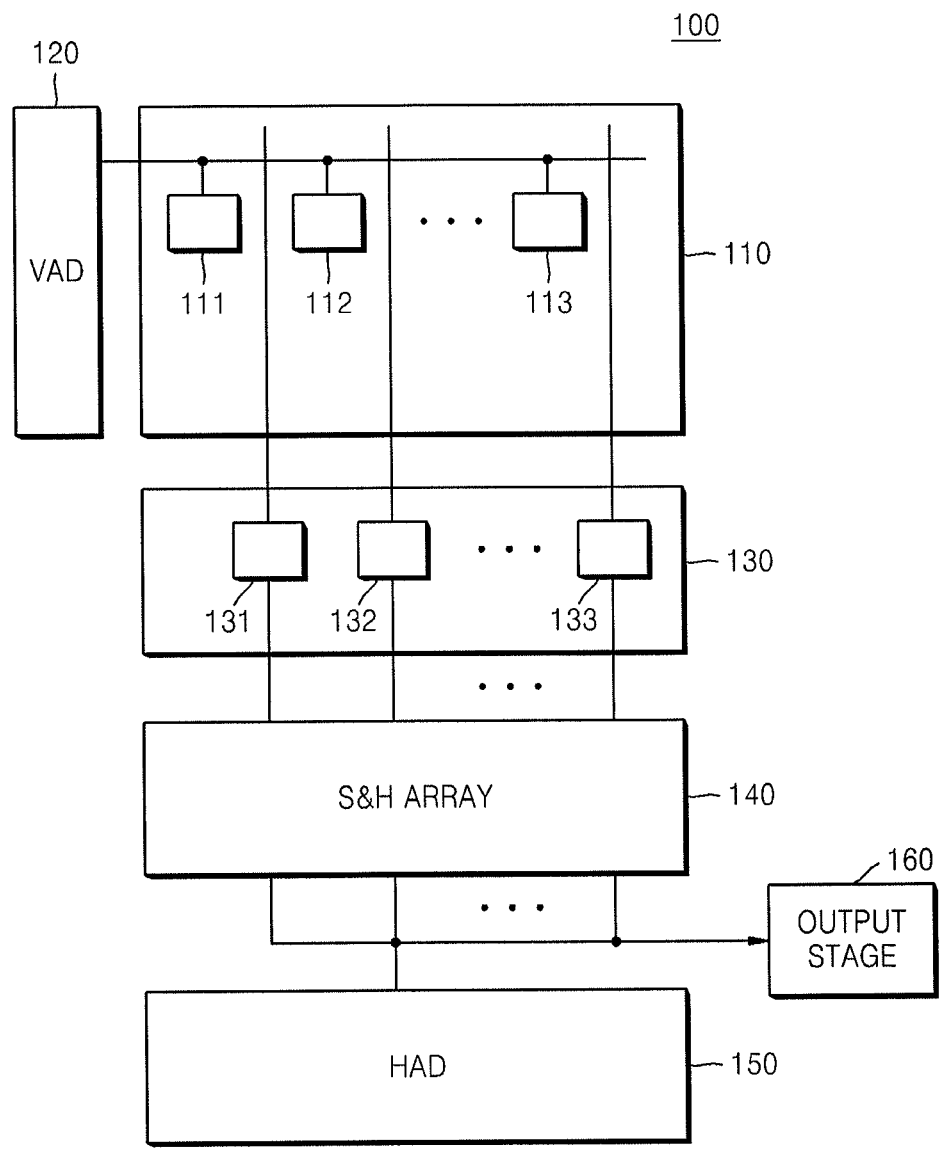
FIG. 1 illustrates a block diagram of an image sensor, according to an embodiment.

Korean Patent Application No. 10-2010-0034392, filed on Apr. 14, 2010, in the Korean Intellectual Property Office, and entitled: "Sampling Circuit and Image Signal Amplifying Circuit Each Including Feedback Clamp Block and Image Sensor Including the Image Signal Amplifying Circuit," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals and characters refer to like elements throughout the specification and drawing figures.

FIG. 1 illustrates a block diagram of an image sensor 100, according to an embodiment of the inventive concept. Referring to FIG. 1, the image sensor 100 may include an image sensor array 110, a vertical address decoder (VAD) 120, a column amplifying array 130, a sample and hold (S&H) array 140, a horizontal address decoder (HAD) 150, and an output stage 160.

The image sensor array 110 may include a plurality of unit image sensor circuits 111 through 113 arranged in a two-dimensional array. The unit image sensor circuits 111 through 113 detect an input image signal. The VAD 120 generates a vertical address that designates one horizontal line of the image sensor array 110. The column amplifying array 130 includes image signal amplifying circuits 131 through 133 that sample and amplify the image signal detected by the unit image sensor circuits 111 through 113 included in the horizontal line activated by the vertical address. In general, the number of the image signal amplifying circuits 131 through 133 is the same as the number of unit image sensor circuits 111 through 113 included in one horizontal line.

The S&H array 140 may include latch circuits that hold the image signal amplified by the column amplifying array 130. The latch circuits sample and hold the amplified image signal according to a regular clock signal. The HAD 150 controls transfer of the amplified image signal held in the S&H array 140 to the output stage 160.

Figure 2:
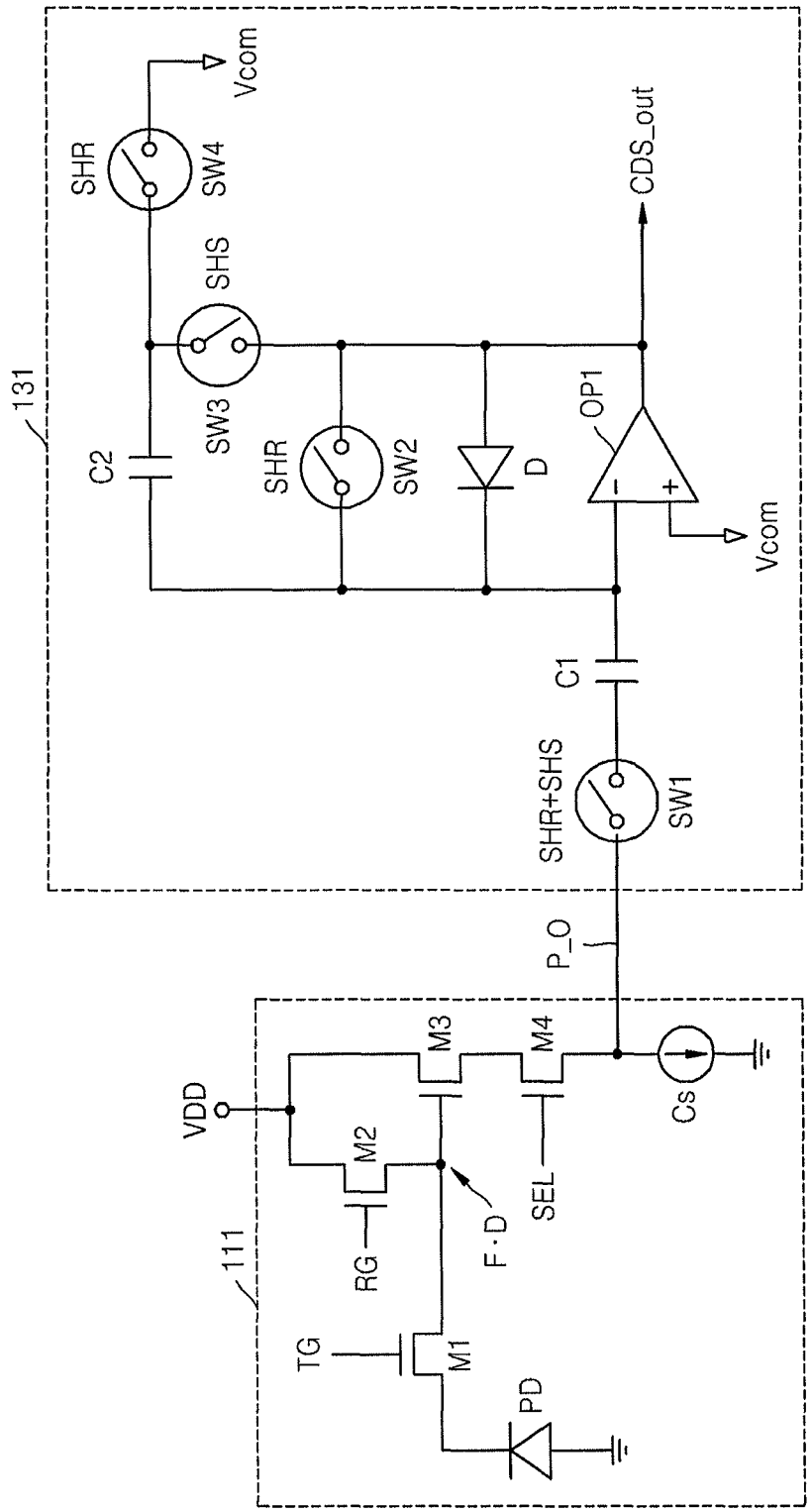
FIG. 2 illustrates a unit image sensor circuit and an image signal amplifying circuit, according to an embodiment.

FIG. 2 illustrates the unit image sensor circuit 111 and the image signal amplifying circuit 131, according to an embodiment. Referring to FIG. 2, the unit image sensor circuit 111 may include a photodiode PD, a transfer transistor M1, a reset transistor M2, a conversion transistor M3, a selection transistor M4, and a current source Cs. The image signal amplifying circuit 131 may include an amplifier OP1, first through fourth switches SW1 through SW4, first and second capacitors C1 and C2, and a clamp block D, here a diode.

The photodiode PD detects an image signal. The transfer transistor M1 transfers the image signal detected by the photodiode PD to a floating diffusion area FD in response to a transfer control signal TG. The reset transistor M2 resets the floating diffusion area FD in response to a reset control signal RG. The conversion transistor M3 generates a converted electric signal that corresponds to an amount of electric charge held in the floating diffusion area FD. The selection transistor M4 outputs an image signal P_O that corresponds to the converted electric signal in response to a selection control signal SEL. The current source Cs controls an amount of current flowing through the selection transistor M4.

A positive input terminal (+) of the amplifier OP1 is connected to a reference voltage Vcom. A voltage level of the reference voltage Vcom may be half of a power voltage VDDA applied to the amplifier OP1.

A first end of the first switch SW1 receives the image signal P_O output from the unit image sensor circuit 111. A first end of the second switch SW2 is connected to a negative input terminal (−) of the amplifier OP1 and a second end of the second switch SW2 is connected to an output terminal CDS_out of the amplifier OP1. A first end of the first capacitor C1 is connected to the second end of the first switch SW1 and a second end of the first capacitor C1 is connected to the negative input terminal (−) of the amplifier OP1. A first end of the second capacitor C2 is connected to the negative input terminal (−) of the amplifier OP1. A first end of the third switch SW3 is connected to the second end of the second capacitor C2 and a second end of the third switch SW3 is connected to the output terminal CDS_out of the amplifier OP1. A first end of the fourth switch SW4 is connected to a common node of the second capacitor C2 and the third switch SW3. A second end of the fourth switch SW4 is connected to the reference voltage Vcom. A first end of the clamp block D is connected to the negative input terminal (−) of the amplifier OP1 and the second end of the clamp block D is connected to the output terminal CDS_out of the amplifier OP1.

Figure 3:
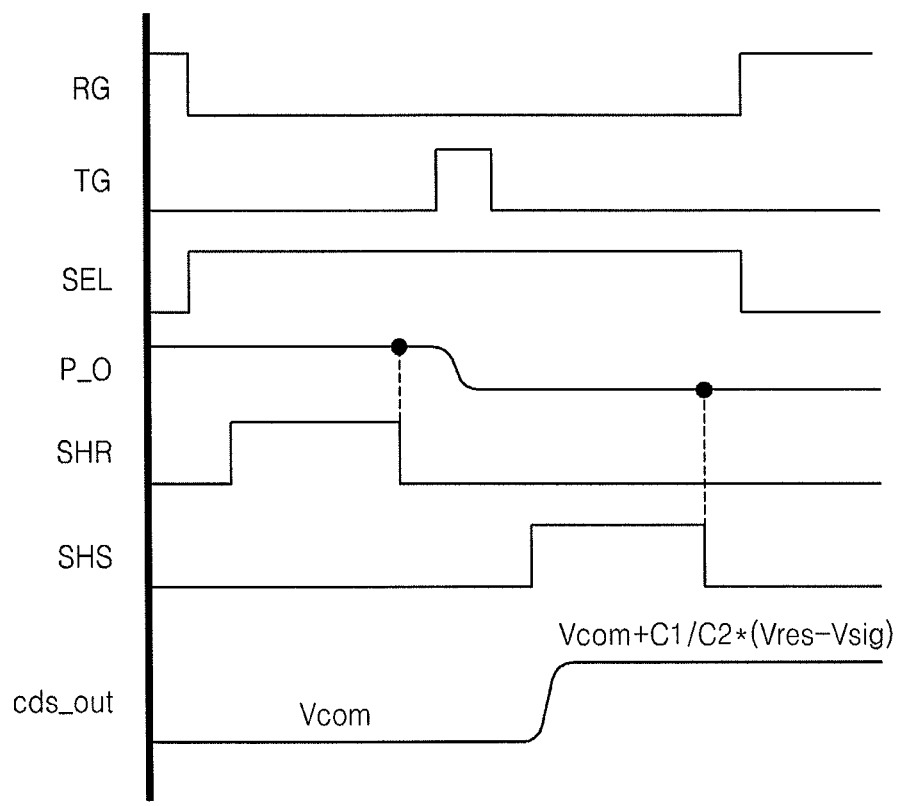
FIG. 3 illustrates a waveform view of signals related to operations of the unit image sensor circuit and the image signal amplifying circuit of FIG. 2 according to an embodiment.

FIG. 3 illustrates waveforms of signals related to operations of the unit image sensor circuit 111 and the image signal amplifying circuit 131.

When the reset control signal RG is in a logic high state, the floating diffusion area FD may be reset.

When the reset control signal RG is in a logic low state and the selection control signal SEL is in a logic high state, the image signal amplifying circuit 131 samples an electric signal Vres that corresponds to an amount of electric charge accumulated in the floating diffusion area FD during a time when a reset sampling signal SHR is in a logic high state. Meanwhile, the amount of electric charge in the floating diffusion area FD is reset according to the reset control signal RG so that the floating diffusion area FD has a regular voltage level. Thus, the output terminal CDS_out of the amplifier OP1 may have the same voltage level as that of the reference voltage Vcom.

When the transfer control signal TG is in a logic high state, the photodiode PD and the floating diffusion area FD are electrically connected to each other and the amount of electric charge in the floating diffusion area FD is changed by an amount of image charge generated by the photodiode PD. An electric signal Vsig that corresponds to the new amount of electric charge accumulated in the floating diffusion area FD is transferred to the image signal amplifying circuit 131 when a sampling signal SHS is in a logic high state. A difference value between the electric signal Vsig and the electric signal Vres is amplified in the amplifier OP1. A voltage level of the output terminal CDS_out of the amplifier OP1 may be determined as shown in Equation 1.

$$V(CDS\_out) = Vcom + (C1/C2) \times (Vres - Vsig) \quad \text{Equation 1}$$

The unit image sensor circuits 111 through 113 are arranged on one horizontal line in the image sensor array 110 illustrated in FIG. 1. In the plurality of unit image sensor circuits 111 through 113, when the intensity of an image signal detected by one unit image sensor circuit from among two adjacent unit image sensor circuits on one horizontal line is relatively greater than the intensity of an image signal detected by the other unit image sensor circuit, band noise may be generated in a horizontal direction.

Figure 4:
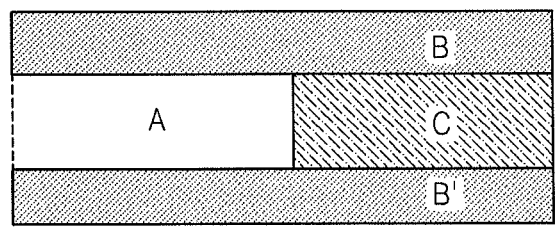
FIG. 4 illustrates a condition in which band noise is generated.

FIG. 4 illustrates a condition by which band noise is generated.

The image sensor array 110 may include a plurality of horizontal lines and a plurality of unit image sensor circuits may be arranged on each of the plurality of horizontal lines. However, for convenience of description, only three horizontal lines will be described. The three horizontal lines may each be formed of at least two horizontal parts, i.e. unit image sensor circuits, adjacent each other.

Referring to FIG. 4, when the intensity of light incident on a predetermined area A that forms a part of one horizontal line is significantly greater than the intensity of light incident on an adjacent area C that forms another part of the horizontal line, band noise is generated. When the intensity of light incident on two horizontal lines B and B' disposed respectively above and below the horizontal line including the two areas A and C is greater than the intensity of light incident on the area C, black band noise is generated. When the intensity of light incident on the two horizontal lines B and B' disposed respectively above and below the horizontal line including the two areas A and C is less than the intensity of light incident on the area C, white band noise is generated.

Figure 5:
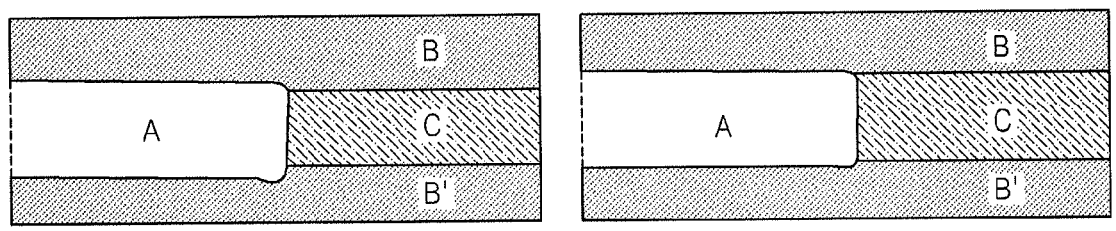
FIG. 5 illustrates forms in which band noise is generated when an image signal is reproduced.

FIG. 5 illustrates forms in which band noise is generated when an image signal is reproduced. In FIG. 5, a left image illustrates a form in which black band noise is generated and a right image illustrates a form in which white band noise is generated.

Without intending to be bound by theory, the following is an explanation of why band noise is generated. First, a case where the clamp block D is not present is described with reference to FIGS. 6 to 9. Then, a case where the clamp block D (which clamps a voltage level of an output voltage of the amplifier OP1) is present is described.

Figure 6:
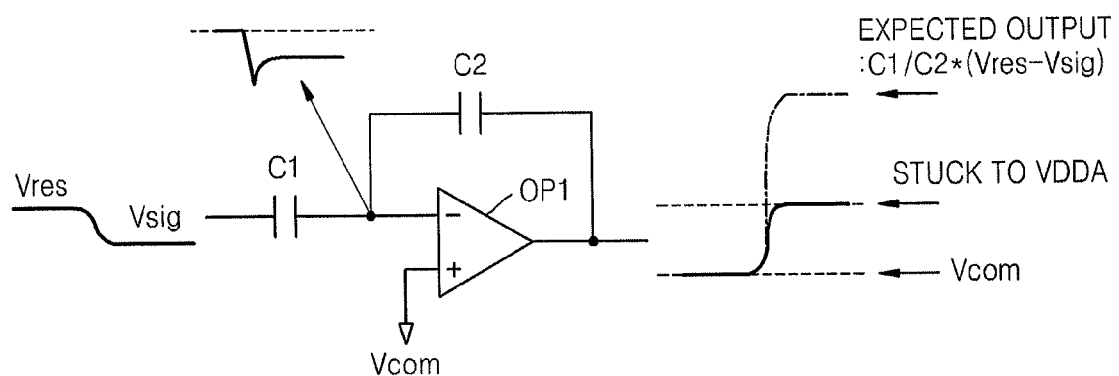
FIG. 6 illustrates a signal output from a unit image sensor circuit and a corresponding signal output from an image signal amplifying circuit obtained by amplifying the signal output from the unit image sensor circuit.

FIG. 6 illustrates a signal output from the unit image sensor circuit 111, and a corresponding signal output from an image signal amplifying circuit that amplifies the signal output from the unit image sensor circuit 111. In FIG. 6, the image signal amplifying circuit may be the same as that as illustrated in FIG. 2, but without the clamp block D.

Referring to FIGS. 2 and 6, the unit image sensor circuit 111 outputs a voltage Vres, which corresponds to the amount of electric charge in the floating diffusion area FD when the floating diffusion area FD is reset, and a voltage Vsig, which corresponds to a sum of an amount of electric charge corresponding to the image signal detected by the photodiode PD and the amount of electric charge in the floating diffusion area FD when the floating diffusion area FD is reset. Furthermore, referring to FIGS. 2 and 3, the two voltages Vres and Vsig are sampled in the image signal amplifying circuit 131 according to the two signals SHR and SHS and a difference between the two voltages Vres and Vsig is amplified and output to the output terminal CDS_out.

Referring to FIG. 6, the difference between the two voltages Vres and Vsig is amplified in the amplifier OP1. The difference Vres−Vsig between the two voltages Vres and Vsig input to the amplifier OP1 is amplified by the ratio of the capacitance of the first capacitor C1 to the capacitance of the second capacitor C2 (that is, C1/C2), as illustrated in Equation 1, and is output from the amplifier OP1. When the difference Vres−Vsig between the two voltages Vres and Vsig is significant enough, the voltage level of the output voltage of the amplifier OP1 needs to be amplified to a voltage higher than the power voltage VDDA as illustrated on a right side of FIG. 6. However, since an output of the amplifier OP1 is fixed to the power voltage VDDA having a low voltage level, a voltage level of the negative input terminal (−) of the amplifier OP1 needs to be low. The positive input terminal (+) and the negative input terminal (−) of the amplifier OP1 need to have virtually the same voltage level, i.e., less than a difference between the power voltage VDDA and the reference voltage Vcom. When a voltage level of the positive input terminal (+) is fixed to be the reference voltage Vcom and the voltage level of the negative input terminal (−) is lower than the reference voltage Vcom, an offset may exist between the two input terminals.

The offset may disappear a predetermined time after the two voltages Vres and Vsig are sampled and amplified. However, when the magnitude of the offset is significantly great, the offset may not disappear after a predetermined time, as indicated by an arrow at the negative input terminal (−). The offset changes a DC bias in an internal circuit of the amplifier OP1 and ultimately increases power consumption in the amplifier OP1. When the magnitude of the offset is small, power consumption in the amplifier may be ignored. However, when the magnitude of the offset is large, power consumption in the amplifier may be increased to a level at which it may not be ignored.

Figure 7:
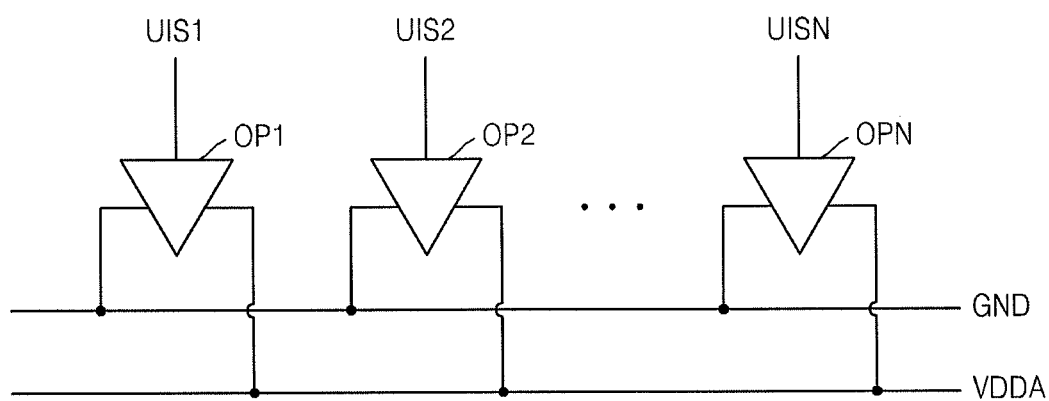
FIG. 7 illustrates connections of a column amplifying array.

FIG. 7 illustrates connections of a column amplifying array.

Referring to FIG. 7, power is supplied to a plurality of amplifiers OP1 through OPN used to amplify image signals from a plurality of unit image sensor circuits UIS1 through UISN using the same power voltages VDDA and GND. Here, N is a natural number. As explained with reference to FIG. 6, when excessive power is consumed by one of the plurality of amplifiers OP1 through OPN, a voltage level of a common voltage, e.g., the power voltage VDDA, may be decreased. If the voltage level of the power voltage VDDA is lower than an ideal voltage level, a DC bias voltage of a circuit that forms another amplifier varies. Thus, it is difficult to convert the DC bias voltage to an electric signal corresponding to an input image signal. The black band noise and white band noise illustrated in FIG. 5 may be generated as described above.

This is described more specifically below.

In a correlated double sampling (CDS) method, a signal output from the unit image sensor circuit is sampled twice and a difference therebetween is converted into an electric signal. A signal Vres output from the unit image sensor circuit is sampled according to the reset sampling signal SHR and a signal Vsig output thereafter is sampled according to the sampling signal SHS. The image signal amplifying circuit outputs a difference between the signals.

Electric characteristics and electric connections of transistors included in an amplifier are determined during manufacturing of the amplifier and may not be changed. Thus, ideally, an offset of an amplifier is not changed between performing sampling twice. However, when the voltage level of the power voltage VDDA is changed, a DC bias voltage level of each node in the amplifier OP is changed. Thus, an offset of the amplifier OP is changed.

As illustrated in FIG. 7, power is supplied to the plurality of amplifiers OH through OPN from the common power voltage VDDA. When excessive power is consumed by one of the plurality of amplifiers OP1 through OPN, the voltage level of the power voltage VDDA is changed.

When the intensities of light applied to two adjacent unit image sensor circuits significantly differ from each other, an offset voltage of an amplifier used to perform sampling twice may vary in an image signal amplifying circuit that samples and amplifies a signal output from the unit image sensor circuit on which light having a relatively low intensity is applied. That is, a voltage level of an offset voltage Voff1 of an amplifier during reset sampling (in which a reset signal is sampled) and a voltage level of an offset voltage Voff2 of an amplifier during signal sampling (in which a detected image signal is sampled) may be different from each other.

Figure 8:
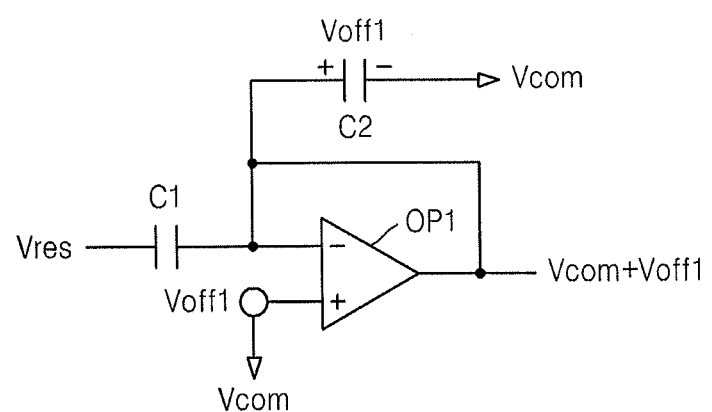
FIG. 8 illustrates an image signal amplifying circuit when a signal output from a unit image sensor circuit is sampled according to a reset sampling signal.

FIG. 8 illustrates an image signal amplifying circuit when the signal Vres output from a unit image sensor circuit 111 is sampled according to the reset sampling signal SHR. In FIG. 8, the image signal amplifying circuit may be the same as that as illustrated in FIG. 2, but without the clamp block D.

Referring to FIGS. 2 and 8, the amplifier OP1 is a buffer, the signal Vres output from the unit image sensor circuit 111 according to the reset sampling signal SHR is transferred to a negative input terminal (−) of the amplifier OP1 through the first capacitor C1, and the second capacitor C2 functions as a load of the amplifier OP1. Here, a sum Vcom+Voff1 of the reference voltage Vcom applied to the positive input terminal (+) of the amplifier OP1 and the offset voltage Voff1 of the amplifier OP1 is an output voltage of the amplifier OP1.

Figure 9:
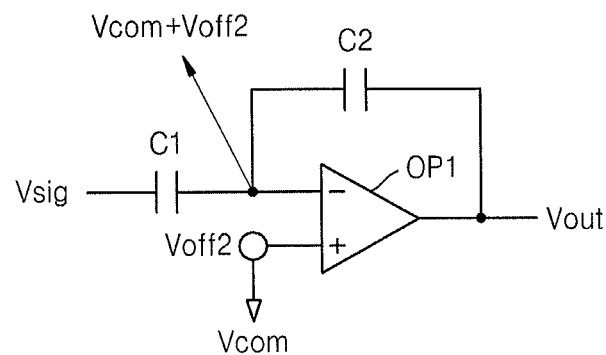
FIG. 9 illustrates an image signal amplifying circuit when a signal output from a unit image sensor circuit is sampled according to a sampling signal.

FIG. 9 illustrates an image signal amplifying circuit when the signal Vsig output from the unit image sensor circuit 111 is sampled according to the sampling signal SHS. In FIG. 9, the image signal amplifying circuit may be the same as that as illustrated in FIG. 2, but without the clamp block D.

Referring to FIGS. 2 and 9, the signal Vsig output from the unit image sensor circuit according to the sampling signal SHS is transferred to the negative input terminal (−) of the amplifier OP1 through the first capacitor C1, and the second capacitor C2 feeds back the output voltage of the amplifier OP1 to the negative input terminal (−). Here, a sum Vcom+Voff2 of the reference voltage Vcom applied to the positive input terminal (+) of the amplifier OP1 and the offset voltage Voff2 of the amplifier OP1 is a virtual voltage of the negative input terminal (−) of the amplifier OP1.

The voltage output from the amplifier OP may be represented by Equation 2.

$$Vout = Vcom + (C1/C2) \times (Vres - Vsig) + (1 + (C1/C2)) \times (Voff2 - Voff1) \quad \text{[Equation 2]}$$

When $(1+(C1/C2)) \times (Voff2 - Voff1)$ in Equation 2 has a positive value or a negative value, white band noise or black band noise is generated, respectively.

When an image signal output from the unit image sensor circuits is sampled and amplified, in general, the intensity thereof is not significantly large. For example, when a voltage level of power supplied to the amplifier OP1 is 5 V (Volts), the maximum intensity of the amplified image signal is less than 2 V. In general, the signal output from the output terminal of the amplifier OP1 is biased to the reference voltage Vcom having a voltage level of about 2.5 V. In this case, intensity of the output voltage of the amplifier may be in the range of about 1.5 V to about 3.5 V. However, when light having excessive intensity is incident, the output of the amplifier OP1 may reach 5 V, i.e., the voltage level of the power voltage VDDA. Thus, an offset voltage of the amplifier OH may be changed, thereby generating band noise.

In order to prevent band noise from being generated, the clamp block D is used according to embodiments so as to maintain the voltage level of the output terminal of the amplifier OP1 to have a regular intensity. In particular, the clamp block D may clamp a difference between a voltage at the output terminal of the amplifier and the negative terminal of the amplifier such that the difference will not exceed a maximum voltage difference. Thus, (Voff2−Voff1) in Equation 2 approaches zero, reducing or eliminating band noise. An acceptable difference may be determined and used as a threshold voltage of the clamp block D.

The clamp block D functions as a clamp and may be realized as a diode, as illustrated in FIG. 2. However, the clamp block D may be realized by using metal oxide semiconductor (MOS) transistors, as illustrated below.

Figure 10:
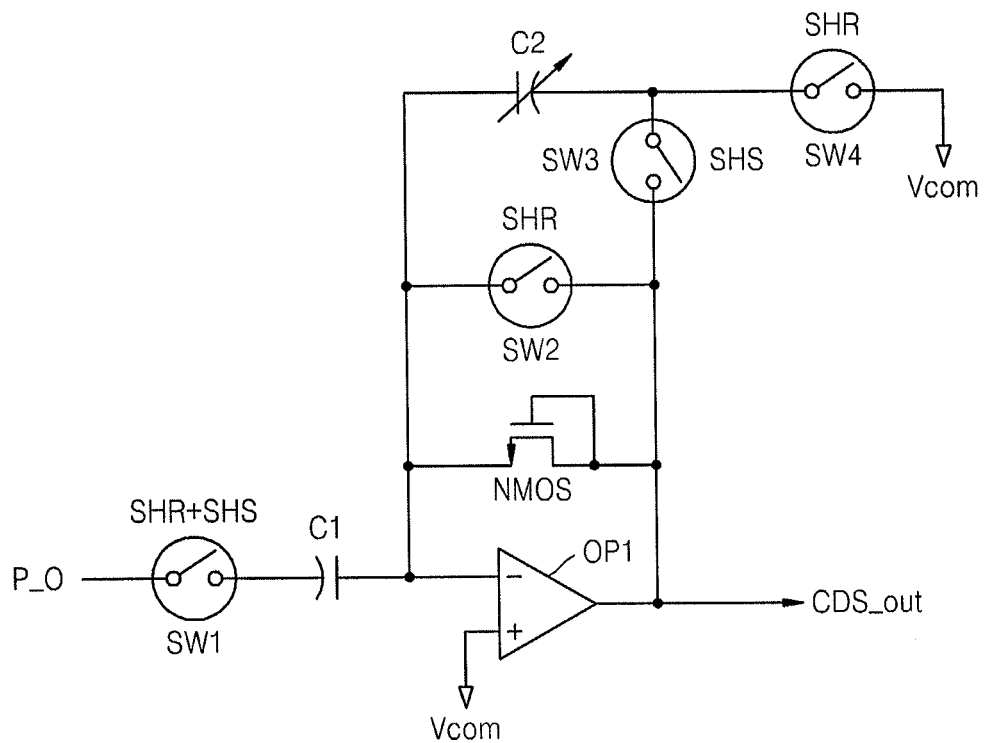
FIG. 10 illustrates a clamp block realized as an N-type metal oxide semiconductor (MOS) transistor.

FIG. 10 illustrates the clamp block D realized as an N-type MOS (NMOS) transistor. Referring to FIG. 10, a drain terminal and a gate terminal of the NMOS transistor are connected to the output terminal of the amplifier OP1 and a source terminal of the NMOS transistor is connected to the negative input terminal (−) of the amplifier OP1.

Figure 11:
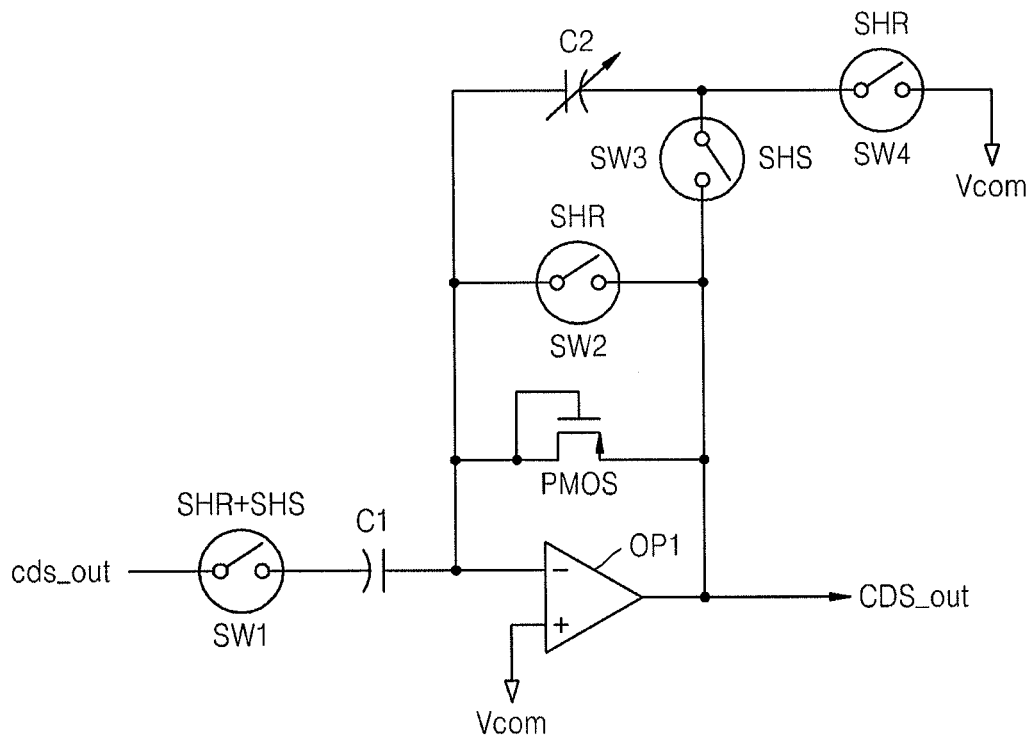
FIG. 11 illustrates a clamp block realized as a P-type MOS transistor.

FIG. 11 illustrates clamp block D realized as a P-type MOS (PMOS) transistor. Referring to FIG. 11, a drain terminal and a gate terminal of the PMOS transistor are connected to the negative input terminal (−) of the amplifier OP1 and a source terminal of the PMOS transistor is connected to the output terminal of the amplifier OP1.

The drain, source, and gate terminals of the NMOS transistor and the PMOS transistor illustrated in FIGS. 10 and 11 are connected to each other so as to operate as a diode. Here, such a connection is called as a diode connection.

In FIGS. 2, 10, and 11, a diode or a MOS transistor is used to realize the clamp block D. In addition, other suitable clamping devices that can maintain a voltage of the output terminal of the amplifier OP1 may serve as the clamp block D in accordance with embodiments.

The clamp block D illustrated in FIG. 2 is realized as one diode connected between the output terminal of the amplifier OP1 and the negative input terminal (−) of the amplifier OP1. When a threshold voltage of the diode is 0.7 V (Volts), a maximum voltage difference between the output terminal and the negative input terminal (−) of the amplifier OP1 is clamped to 0.7 V.

The clamp block may include a plurality of diodes that connect the output terminal to the negative input terminal (−). The number of diodes can be determined according to the voltage level of the output terminal of the amplifier OP1. Thus, the clamp block may be realized in various ways.

Figure 12:
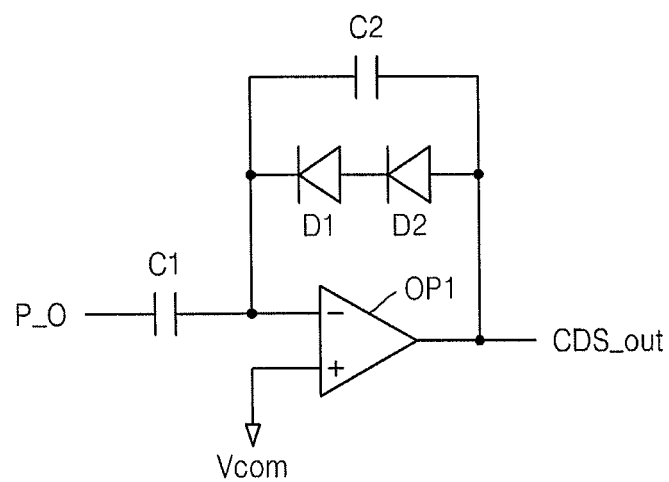
FIG. 12 illustrates a clamp block realized as two diodes connected in series.

FIG. 12 illustrates a clamp block realized as two diodes D1 and D2 connected in series. Referring to FIG. 12, the two diodes D1 and D2 are connected in series. In the diodes D1 and D2, a P-type diffusion area and an N-type diffusion area are connected to each other. The P-type diffusion area of the diode D2 is connected to the output terminal of the amplifier OP1, the N-type diffusion area of the diode D1 is connected to the negative input terminal (−) of the amplifier OP and the N-type diffusion area of the diode D2 is connected to the P-type diffusion area of the diode D1.

When a threshold voltage of each diode is 0.7 V (Volts), the two diodes D1 and D2 connected in series operate when a voltage level of the output terminal of the amplifier OP is higher than about 1.4 V compared with the voltage level of the negative input terminal (−). Accordingly, a difference in between the voltage level of the output terminal and the voltage level of the negative input terminal (−) of the amplifier OP is clamped to a maximum of 1.4 V.

As in FIGS. 2 and 12, a number of diodes may be used to clamp a voltage level of the output terminal of the amplifier OP to have a regular value. Of course, the diodes may also be diode connected transistors.

The threshold voltage of a diode is determined according to forms and concentration of impurities included in a P-type diffusion area and an N-type diffusion area thereof. The threshold voltages of a plurality of diodes realized in the same wafer by one process may be the same as each other or different from each other. Accordingly, although M diodes are connected in series, a voltage level of a clamping voltage may be set to be higher or lower than a voltage level obtained by multiplying the threshold voltage of one diode by M. Here, M is a natural number.

Thus, according to embodiments, a sampling circuit may reduce or prevent offset from occurring when two continuous input signals having significantly different intensities are sampled. The differences in offset may be controlled by clamping a difference between an output of an amplifier and negative input terminal thereof, i.e., clamping a difference to remain below a maximum difference.

According to embodiments, an image signal amplifying circuit may prevent or reduce offset from occurring when two continuous input signals having significantly different intensities are amplified.

According to embodiments, an image sensor may include an image signal amplifying circuit that may prevent offset from occurring when two continuous input signals having significantly different intensities are amplified.

According to embodiments, an image signal processing system includes an image signal amplifying circuit that may prevent offset from occurring when two continuous input signals having significantly different intensities are amplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A sampling circuit that samples an input signal using at least one switch, at least one capacitor, and an amplifier, the sampling circuit comprising:
   a clamp block connected between an output terminal and a negative input terminal of the amplifier, wherein the clamp block prevents a difference between a voltage level of the output terminal of the amplifier and a voltage level of the negative input terminal of the amplifier during sampling from exceeding a maximum voltage difference, the clamp block including at least one of a diode and a diode connected transistor connected to the output terminal of the amplifier,
wherein:
   the amplifier has a positive input terminal connected to a reference voltage;
   the at least one switch includes a first switch and a second switch;
   the first switch has a first end receiving the input signal;
   a second switch has a first end connected to a negative input terminal of the amplifier and a second end connected to an output terminal of the amplifier;
   the at least one capacitor includes a first capacitor and a second capacitor;
   the first capacitor has a first end connected to a second end of the first switch, the first capacitor having a second end connected to the negative input terminal of the amplifier;
   the second capacitor has a first end connected to the negative input terminal of the amplifier; and
   the clamp block has a first end connected to the negative input terminal of the amplifier and a second end connected to the output terminal of the amplifier, the clamp block being connected in parallel with the second switch.

2. The sampling circuit as claimed in claim 1, wherein the clamp block includes a P-type diffusion area connected to the output terminal of the amplifier and an N-type diffusion area connected to the negative input terminal of the amplifier.

3. The sampling circuit as claimed in claim 2, wherein the clamp block includes at least two forward-biased diodes connected in series, each diode having a P-type diffusion area and an N-type diffusion area, a diode at a first end of the series having a P-type diffusion area connected to the output terminal of the amplifier and a diode at a second end of the series having an N-type diffusion area connected to the negative input terminal of the amplifier.

4. The sampling circuit as claimed in claim 3, wherein the at least two diodes each have different threshold voltages.

5. The sampling circuit as claimed in claim 1, wherein the clamp block comprises an N-type metal oxide semiconductor (MOS) (NMOS) transistor having a drain terminal and a gate terminal connected to the output terminal of the amplifier and having a source terminal connected to the negative input terminal of the amplifier.

6. The sampling circuit as claimed in claim 1, wherein the clamp block comprises a P-type metal oxide semiconductor (MOS) (PMOS) transistor having a drain terminal and a gate terminal connected to the negative input terminal of the amplifier and having a source terminal connected to the output terminal of the amplifier.

7. The sampling circuit as claimed in claim 1, wherein the clamp block comprises at least two diode connected MOS transistors connected in series.

8. An image signal amplifying circuit that samples and amplifies an image signal, the image signal amplifying circuit comprising:
an amplifier having a positive input terminal connected to a reference voltage;
a first switch having a first end receiving the image signal;
a second switch having a first end connected to a negative input terminal of the amplifier and a second end connected to an output terminal of the amplifier;
a first capacitor having a first end connected to a second end of the first switch, the first capacitor having a second end connected to the negative input terminal of the amplifier;
a second capacitor having a first end connected to the negative input terminal of the amplifier;
a third switch having a first end connected to a second end of the second capacitor, the third switch having a second end connected to the output terminal of the amplifier;
a fourth switch having a first end connected to a common node of the second capacitor and the third switch, the fourth switch having a second end connected to the reference voltage; and
a clamp block having a first end connected to the negative input terminal of the amplifier and a second end connected to the output terminal of the amplifier, wherein each image signal amplifying circuit performs correlated double sampling (CDS) to store a charge difference during two continuous samplings, wherein the first, second, and fourth switches are turned on and the third switch turned off during a first sampling, and the first and third switches are turned on and the second and fourth switches are turned off during a second sampling.

9. The image signal amplifying circuit as claimed in claim 8, wherein the clamp block has a P-type diffusion area connected to the output terminal of the amplifier and an N-type diffusion area connected to the negative input terminal of the amplifier.

10. The image signal amplifying circuit as claimed in claim 8, wherein the clamp block comprises at least two forward-biased diodes connected in series, each diode having a P-type diffusion area and an N-type diffusion area, a diode at a first end of the series having a P-type diffusion area connected to the output terminal of the amplifier and a diode at a second end of the series having an N-type diffusion area connected to the negative input terminal of the amplifier.

11. The image signal amplifying circuit as claimed in claim 10, wherein the at least two serially connected, forward-biased diodes each have different threshold voltages.

12. The image signal amplifying circuit as claimed in claim 8, wherein the clamp block comprises an N-type metal oxide semiconductor (MOS) (NMOS) transistor in which a drain terminal and a gate terminal thereof are connected to the output terminal of the amplifier and a source terminal thereof is connected to the negative input terminal of the amplifier.

13. The image signal amplifying circuit as claimed in claim 8, wherein the clamp block comprises a P-type metal oxide semiconductor (MOS) (PMOS) transistor in which a drain terminal and a gate terminal thereof are connected to the negative input terminal of the amplifier and a source terminal thereof is connected to the output terminal of the amplifier.

14. The image signal amplifying circuit as claimed in claim 8, wherein the clamp block comprises at least two diode connected MOS transistors connected in series.

15. The image signal amplifying circuit as claimed in claim 8, wherein, when the first sampling is completed, the four switches are turned off and the second sampling is performed after a predetermined time.

16. The image signal amplifying circuit as claimed in claim 8, wherein a voltage level of the reference voltage is half of a voltage level of a power voltage supplied to the amplifier.

17. An image sensor, comprising:
a vertical address decoder that generates a vertical address;
an image sensor array including a plurality of unit image sensor circuits arranged in a two-dimensional array, the plurality of unit image sensor circuits detecting an image signal, the image sensor array outputting image data detected by unit image sensor circuits in one horizontal line activated by the vertical address; and
a column amplifying array including a plurality of image signal amplifying circuits, the plurality of image signal amplifying circuits sampling and amplifying the detected image signal output from the unit image sensor circuits in the one horizontal line, wherein each of the plurality of image signal amplifying circuits includes:
an amplifier having a positive input terminal connected to a reference voltage;
a first switch having a first end receiving the image signal;
a second switch having a first end connected to a negative input terminal of the amplifier and a second end connected to an output terminal of the amplifier;
a first capacitor having a first end connected to a second end of the first switch, the first capacitor having a second end connected to the negative input terminal of the amplifier;
a second capacitor having a first end connected to the negative input terminal of the amplifier;
a third switch having a first end connected to a second end of the second capacitor, the third switch having a second end connected to the output terminal of the amplifier;
a fourth switch having a first end connected to a common node of the second capacitor and the third switch, the fourth switch having a second end connected to the reference voltage; and
a clamp block having a first end connected to the negative input terminal of the amplifier and a second end connected to the output terminal of the amplifier.

18. An image signal processing system comprising an image signal amplifying circuit as recited in claim 8.

19. An image sensor, comprising:
a vertical address decoder that generates a vertical address;
an image sensor array including a plurality of unit image sensor circuits arranged in a two-dimensional array, the plurality of unit image sensor circuits detecting an image signal, the image sensor array outputting image data detected by unit image sensor circuits in one horizontal line activated by the vertical address; and a column amplifying array including a plurality of sampling circuits, the detected image signal serving as the input signal for the plurality of sampling circuits, the plurality of sampling circuits sampling and amplifying the detected image signal output from the unit image sensor circuits in the one horizontal line, wherein each sampling circuit samples an input signal using at least one switch, at least one capacitor, and an amplifier, each sampling circuit includes a clamp block connected between an output terminal and a negative input terminal of the amplifier, and the clamp block prevents a difference between a voltage level of the output terminal of the amplifier and a voltage level of the negative input terminal of the amplifier during sampling from exceeding a maximum voltage difference.

* * * * *